US009490187B2

(12) United States Patent
Joh

(10) Patent No.: US 9,490,187 B2
(45) Date of Patent: Nov. 8, 2016

(54) SEMICONDUCTOR PACKAGE ON WHICH SEMICONDUCTOR CHIP IS MOUNTED ON SUBSTRATE WITH WINDOW

(71) Applicant: SK hynix Inc., Icheon-si Gyeonggi-do (KR)

(72) Inventor: Cheol Ho Joh, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 151 days.

(21) Appl. No.: 14/461,126

(22) Filed: Aug. 15, 2014

(65) Prior Publication Data

US 2015/0279758 A1    Oct. 1, 2015

(30) Foreign Application Priority Data

Mar. 26, 2014  (KR) .......................... 10-2014-0035252

(51) Int. Cl.
| | |
|---|---|
| *H01L 23/31* | (2006.01) |
| *H01L 23/13* | (2006.01) |
| *H01L 23/16* | (2006.01) |
| H01L 23/433 | (2006.01) |
| H01L 23/498 | (2006.01) |

(52) U.S. Cl.
CPC .......... *H01L 23/3157* (2013.01); *H01L 23/13* (2013.01); *H01L 23/16* (2013.01); *H01L 23/49827* (2013.01); *H01L 23/3128* (2013.01); *H01L 23/4334* (2013.01); *H01L 23/49816* (2013.01); *H01L 2224/48091* (2013.01); *H01L 2924/181* (2013.01)

(58) Field of Classification Search
CPC ............... H01L 23/13; H01L 23/4334; H01L 23/49827; H01L 25/0657; H01L 25/0756; H01L 25/117; H01L 2225/06513; H01L 2225/06517; H01L 2225/06562
See application file for complete search history.

(56) References Cited

U.S. PATENT DOCUMENTS

| | | | |
|---|---|---|---|
| 6,395,578 B1 * | 5/2002 | Shin ....................... | H01L 21/56 257/E21.502 |
| 6,982,485 B1 * | 1/2006 | Lee et al. ...................... | 257/737 |
| 7,198,980 B2 * | 4/2007 | Jiang et al. ................... | 438/107 |
| 8,749,044 B2 * | 6/2014 | Kim et al. ..................... | 257/690 |
| 2002/0175401 A1 * | 11/2002 | Huang et al. ................. | 257/686 |
| 2005/0046040 A1 * | 3/2005 | Wang et al. .................. | 257/778 |
| 2009/0184409 A1 * | 7/2009 | Katagiri et al. .............. | 257/686 |
| 2009/0243071 A1 * | 10/2009 | Ha et al. ........................ | 257/686 |

FOREIGN PATENT DOCUMENTS

KR    1020050053246 A    6/2005

* cited by examiner

*Primary Examiner* — Matthew Landau
*Assistant Examiner* — Krista Soderholm
(74) *Attorney, Agent, or Firm* — William Park & Associates Ltd.

(57) ABSTRACT

The semiconductor package includes: a substrate having a window and first and second bond fingers arranged over a first surface along a periphery of the window; a first semiconductor chip disposed within the window and having a plurality of first bonding pads arranged over edges of an upper surface; a plurality of first connection members electrically coupling the first bonding pads with the first bonding fingers; a second semiconductor chip disposed over the first semiconductor chip and the first surface of the substrate and a plurality of second bonding pads in the edges of the lower surface; a plurality of second connection members electrically coupling the second bonding pads with the second bonding fingers of the substrate adjacent to the second bonding pads; and an encapsulation member formed over the first surface of the substrate to cover side surfaces of the second semiconductor chip.

18 Claims, 6 Drawing Sheets

SEMICONDUCTOR PACKAGE ON WHICH SEMICONDUCTOR CHIP IS MOUNTED ON SUBSTRATE WITH WINDOW

CROSS-REFERENCES TO RELATED APPLICATIONS

The present application claims priority under 35 U.S.C. 119(a) to Korean patent application number 10-2014-00035252 filed on Mar. 26, 2014, in the Korean Intellectual Property Office, which is incorporated herein by reference in its entirety.

BACKGROUND

1. Technical Field

The disclosure relates to a semiconductor package, and more particularly, to a semiconductor package capable of solving a warpage problem.

2. Related Art

As electronic products become smaller and more functional, there are needs to increase a capacity of a semiconductor chip as well as to include more chips in the smaller electronic products to satisfy the required function.

However, technologies of manufacturing the semiconductor chip with increased capacity or mounting more number of semiconductor chips show the limitation and as the result, recent trends are directed to embedding more number of semiconductor chips in a single package.

In addition, various technologies for reducing overall thickness of a semiconductor package are being developed.

SUMMARY

In an embodiment of the invention, a semiconductor package includes a substrate having a window in an inside portion and a plurality of first and second bond fingers arranged over a first surface along a periphery of the window. The semiconductor package may also include a first semiconductor chip disposed within the window and having a plurality of first bonding pads arranged over edges of an upper surface. Further, the semiconductor package may include a plurality of first connection members electrically coupling the first bonding pads with the first bonding fingers arranged adjacent to the first bonding pads. The semiconductor package may also include a second semiconductor chip disposed over the upper surface of the first semiconductor chip and the first surface of the substrate adjacent to the first semiconductor chip such that the first bonding pads and the first connection members are exposed, and having a plurality of second bonding pads arranged in the edges of the lower surface. The semiconductor package may also include a plurality of second connection members electrically coupling the second bonding pads with the second bonding fingers of the substrate arranged adjacent to the second bonding pads. Further, the semiconductor package may include an encapsulation member formed over the first surface of the substrate to cover side surfaces of the second semiconductor chip and not an upper surface of the second semiconductor chip.

In an embodiment of the invention, a semiconductor package includes a substrate having a window and a plurality of first and second bond fingers arranged over a first surface along a periphery of the window. The semiconductor package may also include a first semiconductor chip disposed within the window and having a plurality of first bonding pads arranged over edges of an upper surface. The semiconductor package may also include a plurality of first connection members electrically coupling the first bonding pads with the first bonding fingers adjacent to the first bonding pads. Further, the semiconductor package may include a second semiconductor chip disposed over the first semiconductor chip within the window of the substrate such that the first bonding pads and the first connection members are exposed, and having a plurality of second bonding pads arranged in the edges of the upper surface. In addition, the semiconductor package may include a plurality of second connection members electrically coupling the second bonding pads with the second bonding fingers adjacent to the second bonding pads. The semiconductor package may also include a dummy chip disposed over the second semiconductor chip such that the edges of the second semiconductor chip provided with the second bonding pads are exposed. Further, the semiconductor package may include an encapsulation member formed over the first surface of the substrate to cover side surfaces of the dummy chip, the second bonding pads of the second semiconductor chip and the second connection member and not an upper surface of the dummy chip.

In an embodiment of the invention, a semiconductor package includes a substrate having a window and a plurality of bond fingers arranged over a second surface along a periphery of the window. The semiconductor package may also include a semiconductor chip disposed within the window and having a plurality of first bonding pads arranged over edges of a lower surface. In addition, the semiconductor package may include a dummy chip attached onto the lower surface of the semiconductor chip such that the bonding pads are exposed. Further, the semiconductor package may include a plurality of connection members electrically coupling the bond fingers of the substrate with the bonding pads of the semiconductor chip. Further, the semiconductor package may include an encapsulation member formed over some portion of the second surface of the substrate to cover side surfaces of the dummy chip and the bonding pads.

DETAILED DESCRIPTION

Hereafter, various embodiments of the invention will be described in detail with reference to the accompanying figures. Various embodiments are generally directed to a semiconductor package.

Figure 1:
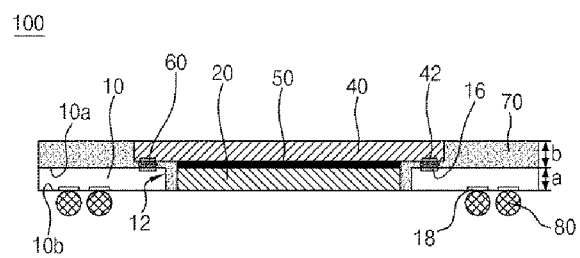
FIG. 1 is a cross-sectional view illustrating a semiconductor package in accordance with an embodiment of the present invention.
Figure 2:
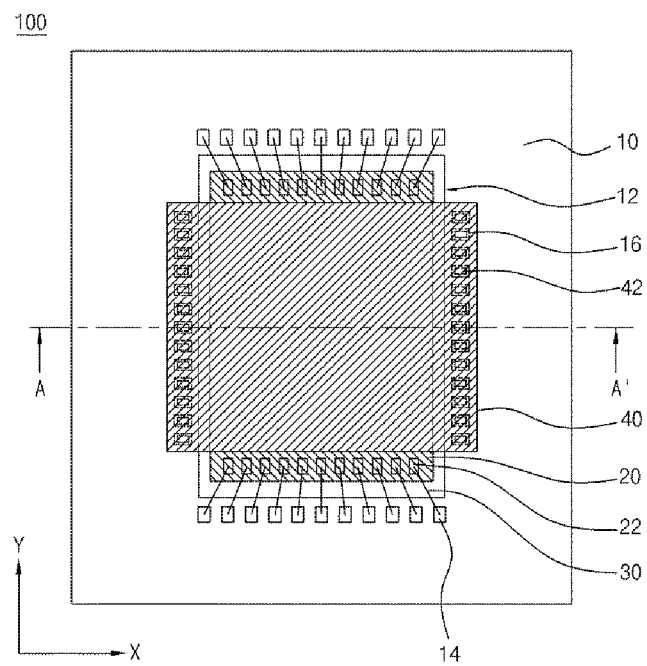
FIG. 2 is a plan view illustrating the semiconductor package of FIG. 1, wherein an encapsulation member is not shown.
Figure 3:
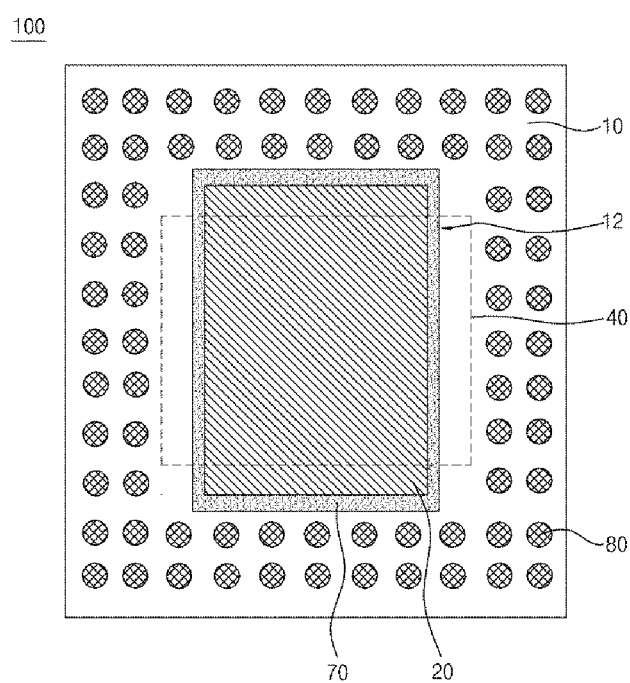
FIG. 3 is a bottom view illustrating the semiconductor package of FIG. 1.

Referring to FIGS. 1 to 3, a semiconductor package 100 in accordance with an embodiment of the invention may include a substrate 10, a first semiconductor chip 20, a second semiconductor chip 40, connection members 30 and 60, and an encapsulation member 70. In addition, the semiconductor package 100 in accordance with an embodiment may further include an adhesive member 50 and external connection electrodes 80. For reference, FIG. 1 is a cross-sectional view taken along a line A-A' in FIG. 2. Unlike FIG. 2, the encapsulation member 70 is shown in FIG. 1.

The substrate 10 may be a printed circuit board. The substrate 10 may have a generally rectangular plate shape. The substrate 10 is provided with a first surface 10a or an upper surface and a second surface 10b or a lower surface. In addition, the substrate 10 may be formed with a window 12 in an inside of the substrate 10. The substrate 10 is further provided with a plurality of bond fingers 14 and 16 disposed over the first surface 10a along the periphery of the window 12. Further, the substrate 10 is provided with a plurality of ball lands 18 over the edges of the second surface 10b.

The bond fingers arranged along a first direction Y are referred to as first bond fingers 14 and the bond fingers arranged along a second direction X perpendicular to the first direction Y are referred to as second bond fingers 16. The numbers of the first and second bonding pads 14 and 16 are not limited to those illustrated in various embodiments and may vary as needed.

The first semiconductor chip 20 may have a generally rectangular plate shape and have a size smaller than that of the window 12 such that the first semiconductor chip 20 is placed within the window 12. The first semiconductor chip 20 may be a memory chip and have an upper surface flush with the first surface 10a of the substrate 10 and a lower surface flush with the second surface 10b of the substrate 10. The first semiconductor chip 20 has a plurality of first bonding pads 22 arranged over two opposite edges of the upper surface in the first direction Y.

In an embodiment, the first semiconductor chip 20 is disposed in a face-up type where the first boding pads 22 are placed over the upper surface. In addition, the lower surface of the first semiconductor chip 20 may be disposed flush with the second surface 10b of the substrate 10. In an embodiment, the first semiconductor chip 20 may have a thickness substantially the same as that of the substrate 10. In such an instance, the upper surface of the first semiconductor chip 20 is disposed substantially flush with the first surface 10a. In addition, the lower surface of the first semiconductor chip 20 is disposed substantially flush with the second surface 10b.

The first bonding pads 22 may be electrically coupled with adjacent first bonding fingers 14 of the substrate 10 by the first connection members 30. The first connection member 30 may be a conductive wire, formed of a metal material, e.g. gold, copper and the like. In an embodiment, the first connection member 30 may include a conductive film or a conductive pattern.

The second semiconductor chip 40 is disposed over the upper surface of the first semiconductor chip 20 and the first surface 10a of the substrate adjacent to the first semiconductor chip 20. In addition, the second semiconductor chip 40 is attached onto the upper surface of the first semiconductor chip 20 by medium of the adhesive member 50. The second semiconductor chip 40 may be a memory chip. The second semiconductor chip 40 has a lower surface which faces the upper surface of the first semiconductor chip 20. The second semiconductor chip 40 may have an upper surface which is opposite to the lower surface. In addition, the second semiconductor chip 420 has a plurality of second bonding pads 42 arranged over two opposite edges of the upper surface in the second direction X.

In an embodiment, the second semiconductor chip 40 is disposed in a face-down type where the second bonding pads 42 are placed over the lower surface. The second semiconductor chip 40 may have a generally rectangular plate shape, and is disposed to expose the first bonding pads 22 of the first semiconductor chip 20 and the first connection members 30. In an embodiment, the second semiconductor chip 40 may have a thickness substantially the same as that of the first semiconductor chip 20.

The second bonding pads 42 of the second semiconductor chip 40 may be electrically coupled with the corresponding second bond fingers 16 of the substrate 10 by the second connection members 60 through a flip-chip bonding process. The second connection member 60 may be a bump, e.g. a solder bump or a stud bump. In an embodiment, the second connection member 60 may be a conductive pattern.

The adhesive member 50 may include an adhesive tape or an adhesive paste and may have a thickness of 25 to 35 μm, preferably 30 μm.

The encapsulation member 70 is formed over the first surface 10a of the substrate 10 to cover side surfaces of the second semiconductor chip 40, but not the upper surface of the second semiconductor chip 40. The encapsulation member 70 is also formed to fill in a space of the window 12 between the substrate 10 and the first semiconductor chip 20. In addition, the encapsulation member 70 is formed to cover the two opposite edges of the first semiconductor chip 20 in the first direction Y including the first bonding pads 22 exposed from and not covered by the second semiconductor chip 20, the first bond fingers 14 and the first connection members 30 interconnecting the first bonding pads 22 and the first bond fingers 14. The encapsulation member 70 may include an epoxy molding compound (EMC).

In an embodiment, it can be appreciated that the encapsulation member 10 is formed only over the periphery of the substrate 10 except for the central portion of the substrate 10. The encapsulation member 70 may be formed with a thickness of 125 to 135 μm, preferably 130 μm. In addition, the encapsulation member 70 may be formed such that the upper surface of the encapsulation member is generally flush with the upper surface of the second semiconductor chip 40.

The external connection electrodes 80 may be solder balls, and may be attached onto the ball lands 18 arranged in the periphery of the second surface 10b of the substrate 10, respectively. The external connection electrode 80 may be any one of a conductive paste, a conductive pattern, a conductive pin and the like.

In the semiconductor package 100 in accordance with an embodiment, warpage can be minimized since the lower surface of the first semiconductor chip 20 and the upper surface of the second semiconductor chip 40 are not covered by the encapsulation member 70.

Warpage in a semiconductor package is caused by difference in thermal expansion coefficient among the substrate, the encapsulation member and the semiconductor chips. Further, warpage generally occurs after the semiconductor chips are covered by the encapsulation member. In an embodiment, the semiconductor chips 20 and 40 that have relatively low thermal expansion coefficients and thus show nearly no warpage are disposed in the central portion of the semiconductor package 100. In contrast, the substrate 10 and the encapsulation member 70 that have relatively high thermal expansion coefficients are disposed only in the periphery of the semiconductor package 100, thereby minimizing overall warpage.

In a case where the semiconductor package has a thin thickness, e.g. a thickness of 1.5 mm or below, thicknesses of the semiconductor chip and the substrate are particularly thin. Accordingly, a force supporting the semiconductor package is weak. In such thin semiconductor package, the warpage due to the difference in thermal expansion coefficient among the substrate, the encapsulation member and the semiconductor chips have critical effects on lowing in workability.

Since the semiconductor package 100 in accordance with an embodiment does not have the substrate 10 and the encapsulation member 70 in the central portion, a warpage problem having a substrate and a semiconductor chip disposed in the central portion of the semiconductor package may be considerably improved and thus an ultra-slim semiconductor package can be realized.

Table 1 below shows warpage variation with ambient temperature change in a semiconductor package having the substrate with a thickness of 80 μm and the encapsulation members with a thickness of 150 μm and 160 μm, respectively. In addition, Table 2 shows warpage variation with ambient temperature change in the semiconductor package in accordance with an embodiment shown in FIG. 1 and having the substrate 10 with a thickness a of 100 μm and the encapsulation members 70 with a thickness b of 130 μm and 140 μm, respectively.

In Table 1 and Table 2, a sign "−" indicates generation of a crying type warpage where the edges descend below the central portion, and no sign, i.e. a sign "+" indicates generation of a smile type warpage where the edges ascend above the central portion.

TABLE 1

| Thickness of encapsulation member | 25° C. | 175° C. | 200° C. | 250° C. |
|---|---|---|---|---|
| 150 μm | −293 μm | 74 μm | 93 μm | 196 μm |
| 160 μm | 55 μm | 99 μm | 78 μm | 156 μm |

TABLE 2

| Thickness of encapsulation member | Thickness of adhesive member | 25° C. | 250° C. |
|---|---|---|---|
| 130 μm | 30 μm | 57.7 μm | −98.0 μm |
| 140 μm | 40 μm | 59.7 μm | −99.9 μm |

Referring to Table 1, warpages of 196 μm and 156 μm are generated respectively at a temperature of over 175° C. when the encapsulation member is formed with a thickness of 150 μm and 160 μm, showing a minor difference of below 40 μm. However, warpages of −293 μm and 55 μm are generated respectively at a room temperature of 25° C. From the above, a 10 μm variation in the thickness of the encapsulation member is found to result in 340 μm difference in warpage of the entire semiconductor package. From table 1, a tolerance in thickness of the encapsulation member is maintained in about ±5 μm. More specifically, for the same products in which a thickness of an entire semiconductor package is 330 to 340 μm, maximum warpage difference of 340 μm is generated within the thickness tolerance of the encapsulation member, showing that realization of an ultra-slim semiconductor package is impossible.

Referring to Table 2, when the encapsulation member is formed to thicknesses of 130 μm and 140 μm and the adhesive member is formed to thicknesses of 30 μm and 40 μm respectively, the semiconductor package shows generation of warpages of −98.0 μm and −99.9 μm at a temperature of 250° C., also showing little difference of about 1.9 μm in the warpage. In addition, the semiconductor package shows generation of warpages of 57.7 μm and 59.7 μm at a room temperature of 25° C., also showing little difference of about 2 μm in the warpage.

Therefore, in the semiconductor package in accordance with an embodiment, warpage problem can be considerably improved since the substrate and encapsulation member are not disposed in the central portion of the package, and thus an ultra-slim package can be realized.

Table 2 shows variation in the thickness of the adhesive member, which is inevitable since change of the thickness of the encapsulation member alone is not possible due to the structural matter. However, the effects of the variation in the thickness of the adhesive member on generation of the warpage can be considered as negligible.

Figure 4:
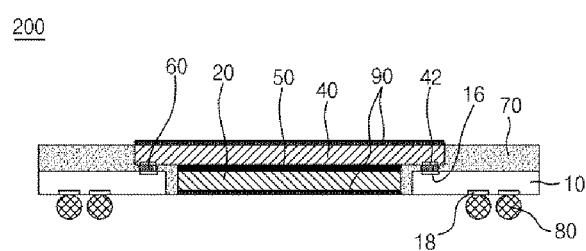
FIGS. 4 and 5 are cross-sectional views illustrating a semiconductor package in accordance with various embodiments of the present invention, respectively.

Referring to FIG. 4, a semiconductor package 200 further includes passivation films 90 formed over the lower surface of the first semiconductor chip 20 and the upper surface of the second semiconductor chip 40 that are exposed to the outside, when compared with the semiconductor package 100 shown in FIG. 1.

The passivation films 90 are to protect the first and second semiconductor chips 20 and 40 from the external influence as the first and second semiconductor chips 20 and 40 are exposed. The passivation film 90 may be formed of an insulation material having a thermal expansion coefficient lower than that of the encapsulation member 70.

The rest of the constitutions of the semiconductor package 200 are the same as those of the semiconductor package 100 shown in FIG. 1. Therefore, duplicated description for the same part will be omitted and the same reference numerals are given to the same parts.

Figure 5:
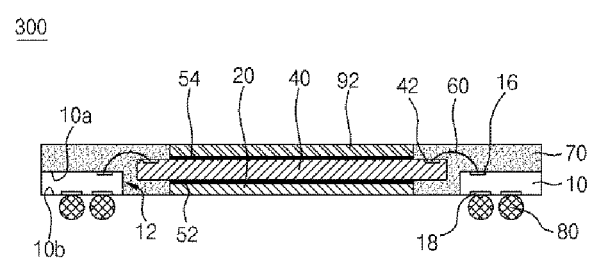
Figure 6:
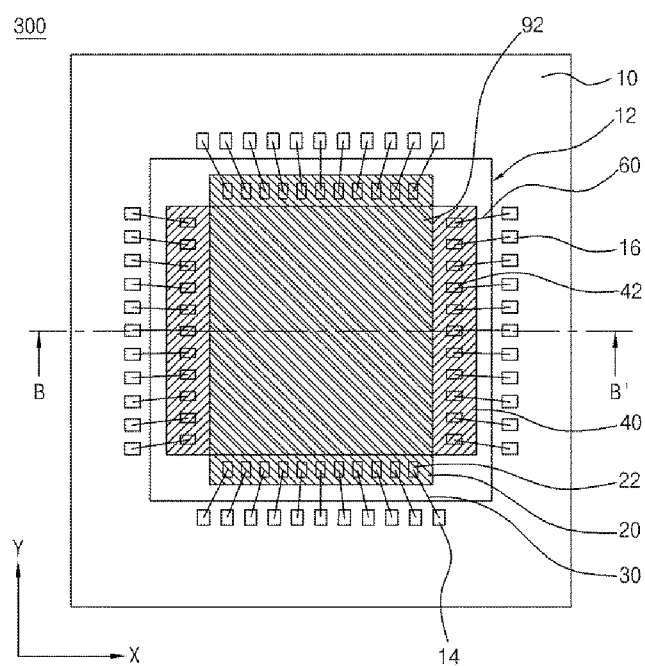
FIG. 6 is a plan view illustrating the semiconductor package of FIG. 5 wherein an encapsulation member is not shown.

Referring to FIGS. 5 and 6, a semiconductor package 300 may include a substrate 10, a first semiconductor chip 20, a second semiconductor chip 40, a second connection member 60, a dummy chip 92 and an encapsulation member 70. The semiconductor package 300 may further include lower and upper adhesive members 52 and 54 and external connection electrodes 80. For reference, FIG. 5 is a cross-sectional view taken along a line B-B' in FIG. 6, wherein unlike FIG. 6, the encapsulation member 70 is shown in FIG. 5.

The substrate 10 is formed with a window 12 in the inside. In addition, the substrate 10 is provided with a plurality of first and second bond fingers 14 and 16 arranged over the first surface 10a or the upper surface of the substrate 10 along the periphery of the window 12. The substrate 10 also includes a plurality of ball lands 18 arranged over the second surface 10b or the lower surface of the substrate 10. The window 12 of the substrate 10 has a size larger than the sizes of the first and second semiconductor chips 20 and 40. As a result, the substrate 10 is electrically coupled with both the first and second semiconductor chips 20 and 40 through a wire bonding process.

The first semiconductor chip 20 is disposed in a face-up type within the window 12 of the substrate 10 such that the lower surface of the first semiconductor chip 20 is flush with the first surface 10a of the substrate 10. For example, the first semiconductor chip 20 may be a memory chip. The first semiconductor chip 20 has a plurality of first bonding pads 22 arranged over two opposite edges of the upper surface in the first direction Y. In an embodiment, the first semiconductor chip 20 preferably has a thickness smaller than that of the substrate 10 in consideration of an overall thickness of the semiconductor package 300.

The first bonding pads 22 of the first semiconductor chip 20 are electrically coupled with adjacent first bonding fingers 14 of the substrate 10 by the first connection members 30. The first connection members 30 may be a conductive wire.

The second semiconductor chip 40 is attached onto the upper surface of the first semiconductor chip 20 by medium of the lower adhesive member 52. The second semiconductor chip 40 may be a memory chip and is disposed in a face up type. In addition, the second semiconductor chip 420 has a plurality of second bonding pads 42 arranged over two opposite edges of the upper surface in the second direction X. Similar to the first semiconductor chip 20, the second semiconductor chip 40 preferably has a thickness smaller than that of the substrate 10 in consideration of an overall thickness of the semiconductor package 300.

The second bonding pads 42 of the second semiconductor chip 40 are electrically coupled with adjacent second bonding fingers 16 of the substrate 10 by the second connection members 60 in a wire bonding method. The second connection member 60 may be a metal wire.

The dummy chip 92 is attached onto an upper surface of the second semiconductor chip 40 by medium of the upper adhesive member 54. The dummy chip 92 may be formed of a material having a lower thermal expansion coefficient such that warpage due to heat in the central portion can be inhibited. The dummy chip 92 may be formed of a silicon material. The dummy chip 92 may be a bare chip formed with no circuit. The dummy chip 92 is attached to expose the two opposite edges of the second semiconductor chip 40 in the second direction X over which the second bonding pads 42 are disposed.

The encapsulation member 70 is formed over the first surface 10a of the substrate 10 to cover side surfaces of the dummy chip 92, the second bonding pads 42 of the second semiconductor chip 40 and the second connection members 60, but not the upper surface of the dummy chip 90. The encapsulation member 70 is also formed to cover the two opposite edges of the first semiconductor chip 20 in the first direction Y including the first bonding pads 22, the first bond fingers 14 and the first connection members 30 interconnecting the first bonding pads 22 and the first bond fingers 14. In addition, the encapsulation member 70 fills in the space of the window 12 between the substrate 10 and the first semiconductor chip 20. In an embodiment, the encapsulation member 70 may have an upper surface generally flush with the upper surface of the dummy chip 92. The encapsulation member 70 may include an EMC.

The external connection electrodes 80 may be solder balls. In addition, the external connection electrodes 80 are attached onto the ball lands 18 arranged in the periphery of the second surface 10b of the substrate 10, respectively. The external connection electrode 80 may be, instead of the solder ball, any one of a conductive paste, a conductive pattern, a conductive pin and the like.

In the semiconductor package in accordance with an embodiment, warpage problem can be considerably improved since the lower surface of the first semiconductor chip 20 and the upper surface of the second semiconductor chip 40 are not covered by the encapsulation member 70. As a result, an ultra-slim package can be realized.

Figure 7:
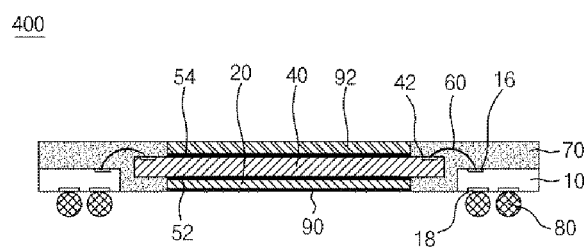
FIGS. 7 and 8 are cross-sectional views illustrating a semiconductor package in accordance with various embodiments of the present invention, respectively.

Referring to FIG. 7, a semiconductor package 400 may further include a passivation film 90 formed over the lower surface of the first semiconductor chip 20 that is exposed to the outside, when compared with the semiconductor package 300 shown in FIG. 5.

The passivation film 90 is, like the dummy chip 92, to protect the first semiconductor chip 20 from the external influence as the lower surface of the first semiconductor chip 20 is exposed. The passivation film 90 may be formed of an insulation material.

The rest of the constitutions of the semiconductor package 400 are the same as those of the semiconductor package 300 shown in FIG. 5. Therefore, duplicated description for the same part will be omitted and the same reference numerals are given to the same parts.

Figure 8:
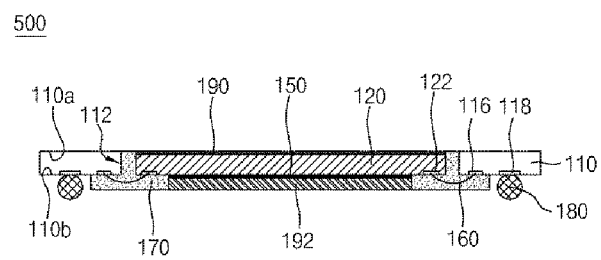

Referring to FIG. 8, a semiconductor package 500 includes a substrate 110, a semiconductor chip 120, connection members 160, encapsulation members 170, external connection electrodes 180 and a dummy chip 192. The semiconductor package 500 further includes a passivation film 190 formed over an upper surface of the semiconductor chip 120.

The substrate 10 is, like in various embodiments, formed with a window 112 in the inside, and has a first surface 110a or an upper surface and a second surface 110b opposite to the first surface 110a. The substrate 110 includes a plurality of bond fingers 116 disposed over two edges of the second surface 110b in the second direction X shown in FIG. 3. The substrate 110 may also include a plurality of ball lands 118 disposed outside the bond fingers 116.

The semiconductor chip 120 has an upper surface corresponding to the first surface 110a of the substrate 110. The semiconductor chip 120 may also have a lower surface corresponding to the second surface 110b of the substrate 110. The semiconductor chip 120 may also include a plurality of bonding pads 122 disposed in two edges of the lower surface in the second direction X shown in FIG. 2. The semiconductor chip 120 has the bonding pads 122 disposed in a face-down type within the window 12 of the substrate 110.

The connection members 160 include wires formed through a wire bonding process such that they electrically couple the bond fingers 116 of the substrate 110 with the corresponding bonding pads 122 of the semiconductor chip 120.

The dummy chip 192 is attached onto the lower surface of the semiconductor chip 120 by medium of the adhesive member 150. The dummy chip 192 may be a bare chip. The dummy chip 192 may be attached to protect the semiconductor chip 120 from the external influence. In addition, the dummy chip 192 may be attached such that it exposes the two edges of the semiconductor chip 120 in the second direction X over which the bonding pads 122 are disposed and the connection members 160.

Over the upper surface of the semiconductor chip 120, a passivation film 190 is formed to protect the semiconductor chip 120 from the external influence. The passivation film 190 may be formed of an insulation material. An upper surface of the passivation film 190 may be generally flush with the first surface 100a of the substrate 110.

The encapsulation member 170 is formed to cover side surfaces of the dummy chip 192, some edge portions of the substrate 110 including the bond fingers 116 and edges of the semiconductor chip 120 including the bonding pads 122, but not the lower surface of the dummy chip 192. At this time, the encapsulation member 170 is formed to not cover the ball lands 118 disposed over the edges of the second surface 110b of the substrate 110. The encapsulation member 170 fills in a space of the window 112 between the substrate 110 and the semiconductor chip 120. The encapsulation member 170 may be EMC and the lower surface of the encapsulation member 170 bay be generally flush with the lower surface of the dummy chip 192.

The external connection electrodes 180 are attached onto the ball lands 118 disposed in the periphery of the second surface 110b of the substrate 110, respectively. The external connection electrode 180 may be a solder ball.

In the semiconductor package in accordance with an embodiment, warpage problem can be considerably improved since like the previous embodiments, the substrate and encapsulation member having high thermal expansion coefficient are not disposed in the central portion of the package. Accordingly, an ultra-slim package can be realized.

The semiconductor package in accordance with various embodiments may be applied to a variety of semiconductor apparatus and package modules having the same.

Figure 9:
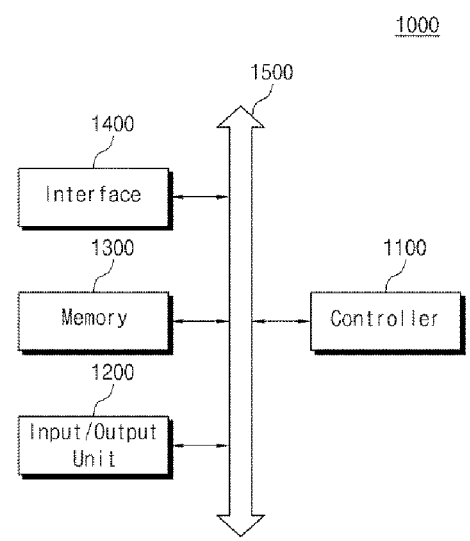
FIG. 9 is a block diagram showing an electronic system to which the semiconductor package in accordance with various embodiments of the present invention is applied.

FIG. 9 is a block diagram showing an electronic system to which the semiconductor package in accordance with various embodiments of the present invention is applied.

As shown, the electronic system 1000 may include a controller 1100, an input/output unit 1200, and a memory 1300. The controller 1100, the input/output unit 1200 and the memory 1300 may be electrically coupled with one another through a bus 1500, which serves as a path through which data move.

The controller 1100 may include at least any one of the following: one or more microprocessors, one or more digital signal processors, one or more microcontrollers, and logic devices capable of performing the same functions as these components. The controller 1100 and memory 1300 may include at least one semiconductor package according to various embodiments of the invention. The input/output unit 1200 may include at least one selected among a keypad, a keyboard, a display device, a touch screen and so forth.

The memory 1300 may store data and/or commands to be executed by the controller 1100 and the like. The memory 1300 may include a volatile memory device and/or a non-volatile memory device, such as a flash memory. For example, a flash memory to which the technology of the invention is applied may be mounted to an information processing system such as a mobile terminal or a desktop computer. The flash memory may be constituted by a solid state drive (SSD). In this instance, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired (or wireless) transceiver.

Though not shown, the electronic system 1000 may further be provided with an application chipset, a camera image process, an input/output device and the like.

The electronic system 1000 may be configured as a mobile system, a personal computer, an industrial computer or a logic system performing various functions. For instance, the mobile system may be any one of a personal digital assistant (PDA), a portable computer, a web tablet, a mobile phone, a smart phone, a wireless phone, a laptop computer, a memory card, a digital music system and an information transmission/reception system.

In the instance where the electronic system 1000 is an equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 10:
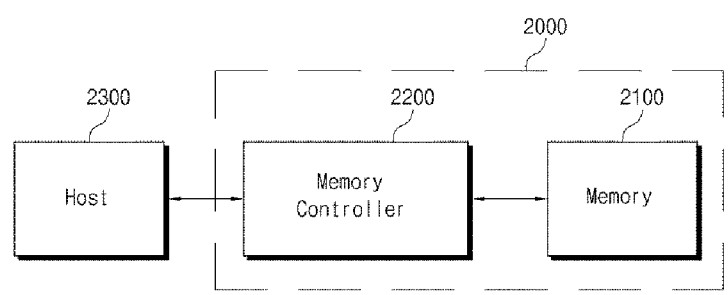
FIG. 10 is a block diagram illustrating a memory card which may include the semiconductor package in accordance with various embodiments of the present invention.

FIG. 10 is a block diagram illustrating a memory card which may include the semiconductor package in accordance with various embodiments of the invention. As shown, the semiconductor package in accordance with various embodiments may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least one of non-volatile memory devices to which the semiconductor package in accordance with various embodiments of the invention is applied. The memory controller 2200 may control the memory 2100 such that stored data is read out or data is stored in response to a read/write request from a host 2300.

While the invention has been described with respect to the specific embodiments, it will be apparent to those skilled in the art that various changes and modifications may be made without departing from the spirit and scope of the invention as defined in the following claims.

What is claimed is:

1. A semiconductor package, comprising:
   a substrate having a window in an inside portion and a plurality of first and second bond fingers arranged over a first surface along a periphery of the window, wherein the first bond fingers are arranged along a first direction and the second bond fingers are arranged along a second direction perpendicular to the first direction, respectively;
   a first semiconductor chip disposed within the window and having a plurality of first bonding pads arranged over edges of an upper surface;
   a plurality of first connection members electrically coupling the first bonding pads with the first bonding fingers arranged adjacent to the first bonding pads;
   a second semiconductor chip disposed onto the upper surface of the first semiconductor chip and the first surface of the substrate adjacent to the first semiconductor chip by medium of an adhesive member such that the first bonding pads and the first connection members are exposed, and having a plurality of second bonding pads arranged in the edges of the lower surface;
   a plurality of second connection members electrically coupling the second bonding pads with the second bonding fingers of the substrate arranged adjacent to the second bonding pads; and
   an encapsulation member formed over the first surface of the substrate to cover only side surfaces of the second semiconductor chip without covering a lower surface of the first semiconductor chip and an upper surface of the second semiconductor chip.

2. The semiconductor package of claim 1, wherein the first bonding pads are arranged over opposite edges of the upper surface in the first direction and the second bonding pads are arranged over opposite edges of the lower surface in the second direction, respectively.

3. The semiconductor package of claim 1, wherein the first connection member includes a metal wire and the second connection member includes a bump.

4. The semiconductor package of claim 1, wherein the encapsulation member is further formed within a space of the window between the substrate and the first semiconductor chip.

5. The semiconductor package of claim 1, further comprising:
passivation films attached onto an exposed lower surface of the first semiconductor chip and the exposed upper surface of the second semiconductor chip.

6. The semiconductor package of claim 1, further comprising:
a plurality of ball lands arranged over a second surface of the substrate opposite to the first surface of the substrate; and
external connection electrodes attached onto the ball lands.

7. A semiconductor package, comprising:
a substrate having a window and a plurality of first and second bond fingers arranged over a first surface along a periphery of the window, wherein the first bond fingers are arranged along a first direction and the second bond fingers are arranged along a second direction perpendicular to the first direction, respectively;
a first semiconductor chip disposed within the window and having a plurality of first bonding pads arranged over edges of an upper surface;
a plurality of first connection members electrically coupling the first bonding pads with the first bonding fingers adjacent to the first bonding pads;
a second semiconductor chip disposed onto the first semiconductor chip within the window of the substrate by medium of a lower adhesive member such that the first bonding pads and the first connection members are exposed, and having a plurality of second bonding pads arranged in the edges of the upper surface;
a plurality of second connection members electrically coupling the second bonding pads with the second bonding fingers adjacent to the second bonding pads;
a dummy chip disposed onto the second semiconductor chip by medium of an upper adhesive member such that the edges of the second semiconductor chip provided with the second bonding pads are exposed; and
an encapsulation member formed over the first surface of the substrate to cover only side surfaces of the dummy chip, the second bonding pads of the second semiconductor chip and the second connection member without covering a lower surface of the first semiconductor chip and an upper surface of the dummy chip.

8. The semiconductor package of claim 7, wherein the first bonding pads are arranged over opposite edges of the upper surface in the first direction, and the second bonding pads are arranged over opposite edges of the lower surface in the second direction.

9. The semiconductor package of claim 7, wherein the encapsulation member is further formed within a space of the window between the substrate and the first and second semiconductor chips.

10. The semiconductor package of claim 7, wherein the first and second connection members include a metal wire.

11. The semiconductor package of claim 7, further comprising:
a passivation film attached onto the lower surface of the first semiconductor chip.

12. The semiconductor package of claim 7, further comprising:
a plurality of ball lands arranged over a second surface of the substrate opposite to the first surface of the substrate; and
external connection electrodes attached onto the ball lands.

13. A semiconductor package, comprising:
a substrate having a window and a plurality of bond fingers arranged over a second surface along a periphery of the window;
a semiconductor chip disposed within the window and having a plurality of first bonding pads arranged over edges of a lower surface;
a dummy chip attached onto the lower surface of the semiconductor chip in the window by medium of an adhesive member such that the bonding pads are exposed;
a plurality of connection members electrically coupling the bond fingers of the substrate with the bonding pads of the semiconductor chip; and
an encapsulation member formed over some portion of the second surface of the substrate and within the window to cover only side surfaces of the dummy chip, the bonding pads, the bond fingers, and the connection members without covering an upper surface of the first semiconductor chip.

14. The semiconductor package of claim 13, wherein the bonding pads are arranged over the opposite edges of the lower surface.

15. The semiconductor package of claim 13, wherein the encapsulation member is further formed within a space of the window between the substrate and the semiconductor chip.

16. The semiconductor package of claim 13, further comprising:
a passivation film attached onto the exposed upper surface of the semiconductor chip.

17. The semiconductor package of claim 13, wherein the connection member includes a wire.

18. The semiconductor package of claim 13, further comprising:
a plurality of ball lands arranged over a portion of the first surface of the substrate not formed with the encapsulation member; and
external connection electrodes attached onto the ball lands.

* * * * *